United States Patent
Takarada

(10) Patent No.: US 7,911,232 B2
(45) Date of Patent: Mar. 22, 2011

(54) INPUT/OUTPUT SIGNAL CONTROLLER

(75) Inventor: Mitsuo Takarada, Saitama (JP)

(73) Assignee: B & Plus K.K., Saitama (JP)

( * ) Notice: Subject to any disclaimer, the term of this patent is extended or adjusted under 35 U.S.C. 154(b) by 0 days.

(21) Appl. No.: 12/811,771

(22) PCT Filed: Jul. 15, 2008

(86) PCT No.: PCT/JP2008/062734
§ 371 (c)(1),
(2), (4) Date: Jul. 6, 2010

(87) PCT Pub. No.: WO2009/133633
PCT Pub. Date: Nov. 5, 2009

(65) Prior Publication Data
US 2010/0277217 A1     Nov. 4, 2010

(30) Foreign Application Priority Data
Apr. 30, 2008  (JP) ................................. 2008-118665

(51) Int. Cl.
*H03K 19/0175* (2006.01)
*H03K 17/16* (2006.01)
(52) U.S. Cl. ............... 326/82; 326/30; 326/86; 327/379
(58) Field of Classification Search .................... 326/26, 326/27, 30, 82, 83, 86; 327/108, 109, 379, 327/419
See application file for complete search history.

(56) References Cited

U.S. PATENT DOCUMENTS

| | | | |
|---|---|---|---|
| 4,496,541 A | 1/1985 | Huang et al. | |
| 7,151,390 B2 * | 12/2006 | Nguyen et al. | 326/30 |
| 2002/0135396 A1 * | 9/2002 | Kiehl | 326/17 |
| 2007/0080716 A1 * | 4/2007 | Strangfeld et al. | 326/83 |

FOREIGN PATENT DOCUMENTS

| | | |
|---|---|---|
| JP | 61-089741 A | 5/1986 |
| JP | 5-153099 A | 6/1993 |
| JP | 10-294750 A | 11/1998 |

OTHER PUBLICATIONS

International Search Report of PCT/JP2008/062734, Mailing Date of Oct. 14, 2008.

* cited by examiner

*Primary Examiner* — Daniel D Chang
(74) *Attorney, Agent, or Firm* — Westerman, Hattori, Daniels & Adrian, LLP

(57) ABSTRACT

To easily judge a transmission signal outputted from an own electronic device. A transmission part 7 outputs a transmission signal to a transmission path 1 side. Switching parts Q1 and Q2 are connected between a constant voltage power source and the transmission path 1, to switch on/off of a signal supplied from the constant voltage power source, being the transmission signal from the transmission part 7, and output it to the transmission path 1. A reception part 9 receives the transmission signal from the transmission path 1. A detection part 13 is connected between the constant voltage power source and the switching parts Q1, Q2, to detect the transmission signal from the transmission part 7 flowing through the switching parts Q1 and Q2. A selection part 15 selects the reception part 9, when the transmission signal from the transmission part 7 is not detected by the detection part 13.

4 Claims, 7 Drawing Sheets

A

B

INPUT/OUTPUT SIGNAL CONTROLLER

TECHNICAL FIELD

The present invention relates to an input/output signal controller, and particularly to an improvement of the input/output signal controller suitably mounted on an electronic device, etc, connected to a bidirectional transmission path such as a CAN (controller area network) bus.

DESCRIPTION OF RELATED ART

In recent years, in an electronic control system for electronically controlling vehicles, etc, as shown in FIG. 6A, a bidirectional communication structure is proposed for bidirectionally communicating a transmission signal among electronic devices A to C, via a 2-wire transmission line 1, with both terminals terminated by termination resistors r1 and r2. Particularly, the transmission path 1 in such a system is called a CAN bus.

Bidirectional communication of the transmission signal is carried out between each electronic device A to C, and other electronic devices A to C, via the transmission path 1. Therefore, for example as shown in FIG. 6B, electronic devices A to C have an input/output signal controller 3 for controlling input/output of the transmission signal to the transmission path 1; and a device main body 5 for outputting the transmission signal to the input/output signal controller 3 and controlling each part of a vehicle based on the transmission signal from the input/output signal controller 3.

For example, as shown in FIG. 7, the input/output signal controller 3 has a structure in which the source side of a FET transistor, wherein a switching part Q1 is formed, is connected to a terminal P1 which is connected to the high potential (5V) side of a constant voltage power source part not shown, and the drain of this transistor is connected forward to a line 1a, which is one of the lines of the transmission path 1, via a protection diode D1. Then, the drain of the FET transistor, wherein a switching part Q2 is formed, is connected forward to other line 1b of the transmission path 1 via a protection diode D2, and the source of this transistor is connected to a common potential side (0V: GND) of the constant voltage power source from terminal P2. Further, the input/output signal controller 3 has a transmission part 7 connected to gates of the switching parts Q1 and Q2 for transmitting the transmission signal from the device main body 5 to the transmission path 1 side, and a reception part 9 for receiving the transmission signal from the transmission path 1 and outputting it to the device main body 5.

The transmission part 7 and the reception part 9 are operated by power supply from terminals P1 and P2 of the constant voltage power source part. Particularly, the reception part 9 outputs an output ("H" level) state (called a "dominant state" in many cases) of the transmission signal from electronic devices A to C, and a non-output ("L level") state (called a "recessive state" in many cases) of the transmission signal, to the device main body 5.

In such an input/output signal controller 3, when the transmission signal from the device main body 5 is inputted into the transmission part 7, the switching parts Q1 and Q2 are turned-on (ON) by the transmission part 7 based on the transmission signal, and power supply current flows from the constant voltage power source to the transmission path 1 side through the terminal P1, switching part Q1, and protection diode D1, and the power supply current flows from the transmission path 1 side to the terminal P2 through the protection diode D2 and the switching part Q2, to thereby transmit the transmission signal to the transmission path 1 side, and make the level of the transmission path 1 set in the "dominant state".

Meanwhile, when the level of the transmission path 1 is set in the "dominant state" by other electronic devices A to C, the transmission signal is inputted into the reception part 9 from the transmission path 1 side, and the reception part 9 outputs the transmission signal to the device main body 5.

Incidentally, as a general technique of this kind, for example the technique disclosed in patent document 1 (Japanese Patent Laid Open Publication No. 2002-176427) can be given.

(Patent Document 1)
Japanese Patent Laid Open Publication No. 2002-176427

DISCLOSURE OF THE INVENTION

Problem to be Solved by the Invention

However, in the aforementioned input/output signal controller 3, when the switching parts Q1 and Q2 are turned-on (ON) to set the level of the transmission path 1 in the "dominant state" and transmit the transmission signal to the transmission path 1 side, the transmission signal transmitted from the transmission part 7 is inputted into the reception part 9. Therefore, there is a necessity for judging the transmission signal received by the reception part 9, namely, whether or not the received transmission signal is transmitted from own electronic devices A to C. Therefore, in order to prevent malfunctions, the device main body 5 needs to have a special structure.

In order to solve such a problem, the present invention is provided, and an object of the present invention is to provide the input/output signal controller capable of detecting the transmission signal from own electronic devices, and facilitating prevention of the malfunctions on the own device side.

Means for Solving the Problem

In order to solve the above-described problem, an input/output signal controller according to the present invention includes:

a transmission part for outputting a transmission signal to a transmission path side, with termination resistors connected to both ends;

switching parts connected to a constant voltage power source with the transmission path interposed, for switching on/off of power supply from the constant voltage power source and outputting the transmission signal to the transmission path, being the transmission signal from the transmission part;

a reception part for receiving the transmission signal from the transmission path;

a detection part connected between the constant voltage power source and the switching parts, for detecting output of the transmission signal flowing through the switching parts from the transmission part; and a selection part for selecting the reception part when the output of the transmission signal from the transmission part is not detected by the detection part.

According to other aspect of the input/output signal control device of the present invention, the detection part has a resistor serially connected between the constant voltage power source and the switching parts.

According to other aspect of the input/output signal controller of the present invention, when a both-end voltage is highest, being the both-end voltage of the detection part in a state that the transmission signal is outputted from the transmission part, the detection part controls the selection part so as not to select this reception part.

According to other aspect of the input/output signal controller of the present invention, the transmission path is a wired transmission path connected to a wireless transmission path.

Advantage of the Invention

According to the input/output signal controller of the present invention, when the transmission signal is outputted to the transmission path by the transmission part by turning on/off the switching parts, the output of the transmission signal flowing through the switching parts is detected by the detection part. However, when the transmission signal is not detected by the detection part, the selection part selects the reception part so that a received signal can be outputted. Therefore, when the received transmission signal is transmitted from the own electronic device, the detection part detects the received signal and the selection part allows it not to be outputted, thereby facilitating the prevention of the malfunctions on the own device side.

According to the input/output signal controller of the present invention, the detection part has the resistor serially connected between the constant voltage power source and the switching parts. Therefore, the structure of the detection part can be simplified.

According to the input/output signal controller of the present invention, when the both-end voltage is highest, being the both-end voltage of the detection part in a state that the transmission signal is outputted from the transmission part, the detection part controls the selection part so as not to select this reception part. With this structure, accurate detection of the transmission signal from the own electronic device is facilitated.

According to the input/output signal controller of the present invention, the transmission path is the wired transmission path connected to the wireless transmission path. Therefore, the input/output signal controller 3 of the present invention can also be implemented in the wired transmission path having the wireless transmission path interposed in the middle of the path.

BEST MODE FOR CARRYING OUT THE INVENTION

Preferred embodiments of the present invention will be described hereafter, with reference to the drawings. Note that the same signs and numerals are assigned to the same parts of a conventional example.

FIG. 1 is a schematic block diagram showing an embodiment of an input/output signal controller 3 according to the present invention. Note that in FIG. 1, the aforementioned electronic device A of FIG. 6 is taken as an example.

In FIG. 1, as shown in FIG. 6, the transmission path 1 is composed of 2-wire type signal lines 1a and 1b, being a CAN bus that carries out bidirectional communication of a transmission signal such as digital data, among electronic devices A to C (not shown in FIG. 1, see FIG. 6). Both terminal ends of the signal lines 1a and 1b are terminated by 120Ω indicated by termination resistors r1 and r2, which is the same resistance value as impedance of these signal lines.

The electronic devices A to C are, for example, a control device of an electronic combustion engine, a detection device, a searching device, and a storage device, etc, in a vehicle, etc, thereby forming a vehicle electronic control system. The input/output signal controller 3 of the present invention controls input/output of the transmission signal between a device main body 5 and the transmission path 1 in individual electronic device A to C.

The source side of a P-channel FET transistor, wherein a switching part Q1 is formed, is connected to terminal P1 which is connected to a high potential (5V) side of a constant voltage power source part not shown.

The drain of the transistor is connected forward to a line 1a, which is one of the lines of the transmission path 1, via a protection diode D1, and the output side of a transmission part 7 as will be described later is connected to a gate of the transistor.

The drain of an N-channel FET transistor, wherein a switching part Q2 is formed, is connected forward to other line 1b of the transmission path 1, via a protection diode D2. The source of the transistor is connected to terminal P2 via a detection resistor R, and the output side of the transmission part 7 is connected to the gate of the transistor. The terminal P2 is connected to a common potential side (0V: GND) of the constant voltage power source part.

The transmission part 7 is a driver circuit, for inputting the transmission signal transmitted from the aforementioned device main body 5, then simultaneously turning on/off (ON/OFF) switching parts Q1 and Q2, so that power supply (power supply current) flows to the transmission path 1, and the transmission path 1 is set at "H" level, being a "dominant state". Note that "L" level is a "recessive state", thereby not allowing the power supply current to flow through the transmission path 1.

A reception part 9 is connected to the lines 1a and 1b of the transmission path 1. The reception part 9 has a function of inputting the "H" level of the transmission path 1, and amplifying and outputting it to a selection part 15. Namely, the reception part 9 detects and outputs the "dominant state" of the transmission path 1.

A comparison part 11 is connected to a connection point between the switching part Q2 and the detection resistor R, and a detection part 13 is formed by the detection resistor R and the comparison part 11.

The comparison part 11 has a function of comparing both end voltage v of the detection resistor R and previously set reference voltage V, and when the both end voltage v exceeds the reference voltage v, has a function of detecting the level of the transmission path 1 to be in the "dominant state" only by the transmission part 7, and also has a function of controlling the selection part 15 by outputting a control signal S to the selection part 15 during detection of the "dominant state".

When the detection part 13 detects the level of the transmission path 1 to be in the "dominant state" only by the transmission part 7, the selection part 15 has a function of opening an input connection from the reception part 9, and cutting-off output of an output signal to the device main body 5 from the reception part 9, and meanwhile when the "dominant state" is not detected, the selection part 15 has a function of selecting connection to input from the reception part 9, and securing output of the output signal to the device main body 5 from the reception part 9.

Note that the transmission part 7, reception part 9, comparison part 11, and selection part 15 are operated by the power supply from the constant voltage power source part.

Next, an operation of the input/output signal controller 3 of the present invention will be described.

When the transmission signal is inputted into the transmission part 7 from the device main body 5 of the electronic device A, the switching parts Q1 and Q2 are simultaneously turned on/off (ON/OFF) by the transmission part 7 based on the transmission signal, and for example as shown in FIG. 2A, pulse current flows to the transmission path 1 side from the constant voltage power source 1 through the terminal P1, the switching part Q1, and the protection diode D1, and also the pulse current flows to the terminal P2 from the transmission path 1 side through the protection diode D2 and the switching part Q2, then the transmission path 1 is set at "H" level, being the "dominant state", so that the transmission signal is transmitted to the transmission path 1 side.

By setting the level of the transmission path 1 in the "dominant state", the transmission signal from the electronic device A is incorporated in other electronic devices B and C. Note that in order to identify electronic devices A to C to which the transmission signal is transmitted, for example, addresses or identification codes of the electronic devices A to C may be assigned to the transmission signal.

At this time, when the level of the transmission path 1 is set in the "dominant state" only by the electronic device A, the power supply current flowing through the transmission path 1 by the electronic device A, flows through the detection resistor R via the termination resistors 1a and 1b of both ends, thus generating a great potential difference on both ends of the detection resistor R.

In such a state, if the reference voltage V of the comparison part 11 is set so that the both end voltage v of the detection resistor R exceeds the reference voltage V, the both end voltage v of the detection resistor R is added to the comparison part 11 and is compared with the reference voltage V, then the detection part 13 detects the output of the transmission signal from the transmission part 7 and outputs a control signal S to the selection part 15. Then, the selection part 15 carries out opening control of the connection to the reception part 9.

Meanwhile, in a state that the switching parts Q1 and Q2 are turned off (OFF), the both end voltage v of the detection resistor R is approximately close to a common potential side (0V: GND) of the constant voltage power source part, then the control signal S is not outputted from the comparison part 11, and the selection part 15 secures the connection to the reception part 9. Therefore, the transmission signal inputted into the reception part 9 from the transmission path 1 is outputted to the device main body 5 via the selection part 15.

Further, in a state that the level of the transmission path 1 is set in the "dominant state" by other electronic device B or C and the switching parts Q1 and Q2 of the electronic device A is set in on (ON) operation, the power supply current flows through the detection resistor R, to thereby generate the potential difference on both ends.

However, the both end potential difference of the detection resistor R is smaller than the reference voltage V, compared with the potential difference in a case of on (ON) operation of the switching parts Q1 and Q2 only by the electronic device A, and the control signal S is not outputted from the comparison part 11. Accordingly, the selection part 15 secures the connection to the reception part 9, and therefore the transmission signal inputted into the reception part 9 from the transmission path 1 is outputted to the device main body 5 via the selection part 15.

Namely, even if a plurality of electronic devices B and C including the electronic device A are set in the "dominant state", ½ of the current flowing through the termination resistors r1 and r2 flows through the electronic device A itself and other electronic device B or C respectively, thereby decreasing a voltage drop generated in the detection resistor R.

It is also probable that the level of the transmission path 1 is set in the "dominant state" by the electronic devices B and C including the electronic device A. However, which of the electronic devices A to C makes the level of the transmission path 1 set in the "dominant state" can be discriminated on the device main body 5 side, based on presence/absence of the transmission signal outputted from the own device.

FIG. 3 shows the variation of the both end voltage v (v1>v2>v3) of the detection resistor R, regarding "dominant by own device" and "recessive by own device", being the "dominant state" and the "recessive state" of the level of the transmission path 1 by the own device, and regarding "dominant by other device" and "recessive by other device", being the "dominant state" and the "recessive state" of the level of the transmission path 1 by other device, when the electronic device A is set as the own device and the electronic devices B and C are set as other devices.

Thus, the input/output signal controller 3 of the present invention includes: the transmission part 7 for outputting the transmission signal to the transmission path 1 side, with termination resistors r1 and r2 connected to both ends; the switching parts Q1 and Q2 connected to the constant voltage power source, with the transmission path 1 interposed, for switching on/off of the power supply current from the constant voltage power source, being the transmission signal from the transmission part 7, and outputting the transmission signal to the transmission path 1; the reception part 9 for receiving the transmission signal from the transmission path 1; the detection part 13 connected between the constant voltage power source and the switching parts Q1 and Q2, for detecting the output of the transmission signal from the transmission part 7 flowing through the switching parts Q1 and Q2; and the selection part 15 for selecting the reception part 9 and outputting the received signal when the output of the transmission signal from the transmission part 7 is not detected by the detection part 13.

Therefore, if the both end voltage of the detection resistor R in the output state of the transmission signal from the transmission part 7, is a previously set highest both end voltage, the selection part 15 does not select the reception part 9, and when the both end voltage of the detection resistor R is the lower value, the selection part 15 selects the reception part 9. As a result, when only the own electronic device A outputs the transmission signal to the transmission path 1, thereby setting the level of the transmission path 1 in the "dominant state", such a dominant state is detected and the transmission signal is hardly outputted to the device main body 5 from the reception part 9. Thus, the malfunction of the electronic device A can be prevented.

In addition, the output of the transmission signal from the transmission part 7 flowing through the switching parts Q1 and Q2, is detected by the detection resistor R. Therefore, the structure of the detection part 13 can be simplified.

Incidentally, in the input/output signal controller of the present invention, when the both end voltage of the detection resistor R in the output state of the transmission signal from the transmission part 7, is the previously set highest both end voltage, the selection part 15 is controlled so as to select the reception part 9. With this structure, the "dominant state" can be easily detected, regarding the level of the transmission path 1 only by the own electronic device.

In addition, a greatest voltage drop is generated and a great both end voltage is generated when the level of the transmission path 1 is set in the dominant state only by the electronic device A. Therefore, if the reference voltage V of the comparison part 11 is set to be a value lower than this great both end voltage value, the selection part 15 is controlled to surely ignore the output from the reception part 9 only in a case of exceeding the set value.

Then, the aforementioned detection part 13 is not limited to the structure composed of the detection resistor R and the comparison part 11. However, in the structure having the detection resistor R serially connected between the constant voltage power source and the switching parts Q1, Q2, and the connection to the reception part 9 is opened (cut-off) by controlling the selection part 15 based on small/large of the generated both end voltage of the detection resistor R, there is an advantage that the structure of the detection part can be simplified.

Incidentally, in the input/output signal controller 3 of the present invention, explanation is given for a case that the transmission path 1 is the wired transmission path. However, the input/output signal controller of the present invention can be implemented even in the transmission path 1, with the wireless transmission path interposed and connected in the middle of the path.

FIG. 4 shows a structure in which wired transmission paths 1 are connected to each other by remote coupler devices 17, 19, being the wireless transmission paths.

As shown in FIG. 5, the remote coupler devices 17, 19 include the input/output signal controller 3 of the present invention, a modulation part 21, resonant parts 23, 25, and a demodulation part 27, and are connected to the transmission path 1.

The remote coupler devices 17, 19 have the same structures, and in addition, have a constituent element such as a power supply part. However, this is not an essential part and therefore explanation therefore is omitted and is not shown.

The modulation part 21 of the remote coupler device 17 oscillates, for example, a high frequency signal of 100 MHz, and modulates the high frequency signal by the transmission signal (pulse signal) outputted from the input/output signal controller 3 (selection part 15) and outputs it to the resonant part 23. The modulated high frequency signal is shown, for example, in FIG. 2B (This figure B is magnified).

The resonant part 23 is an LC resonant circuit that is resonated with a modulated high frequency signal, and emits the resonated signal to outer device (remote coupler device 19). The resonant part 25 is the LC resonant circuit that is resonated with the modulated high frequency signal emitted from the outer remote coupler device 19, then induces the high frequency signal and outputs it to a demodulation part 27.

The demodulation part 27 demodulates the high frequency signal from the resonant part 25 and outputs the transmission signal (pulse signal) to the input/output signal controller 3 (transmission part 7). The other structure is the same as the structure of FIG. 1.

The structure and the operation of the remote coupler device 19 are the same as those of the remote coupler device 17, and therefore the explanation therefore is omitted.

Thus, the input/output signal controller 3 of the present invention can be implemented even in the wired transmission path 1 connected to other wireless transmission path, and can be implemented in a wider utilization range. In addition, the above-described effect can be obtained.

Figure 1:
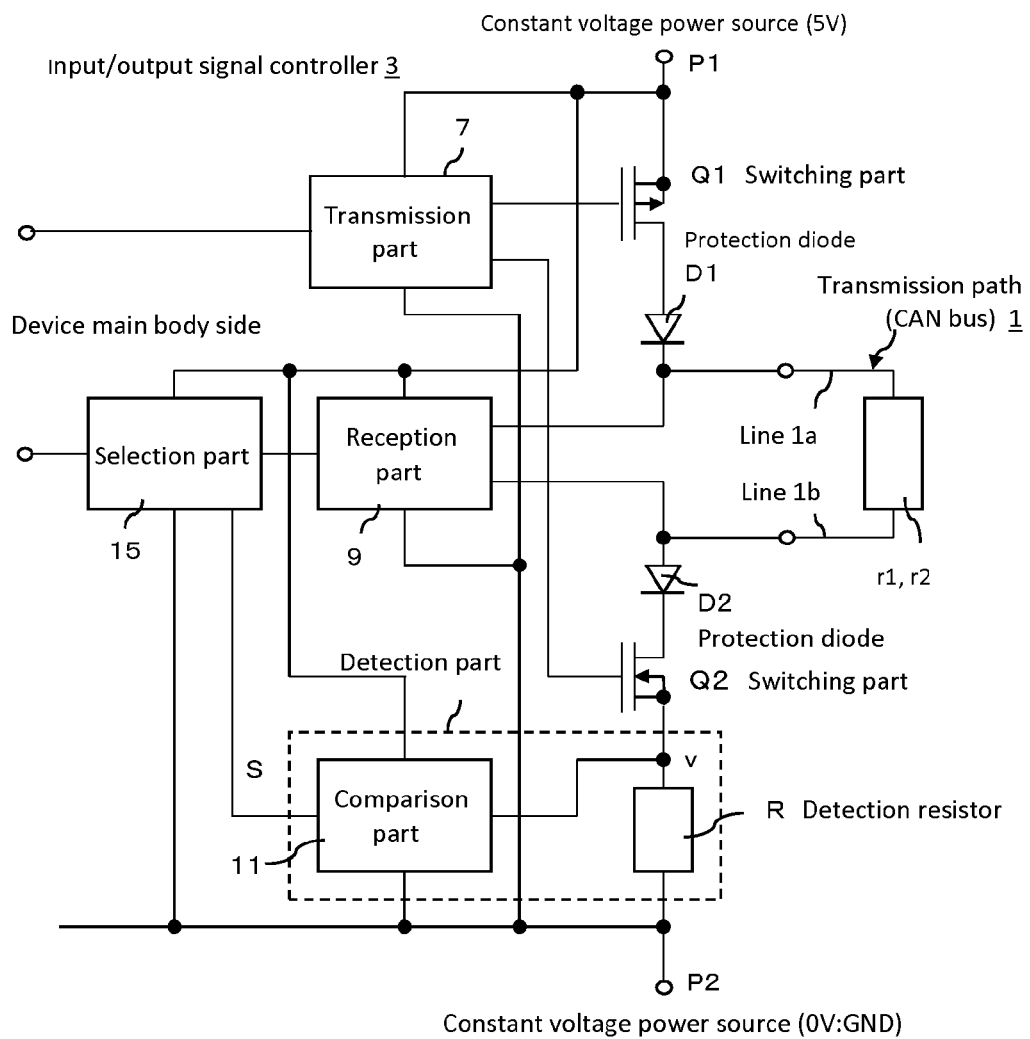
FIG. 1 is a block diagram showing an embodiment of an input/output signal controller according to the present invention.
Figure 2:
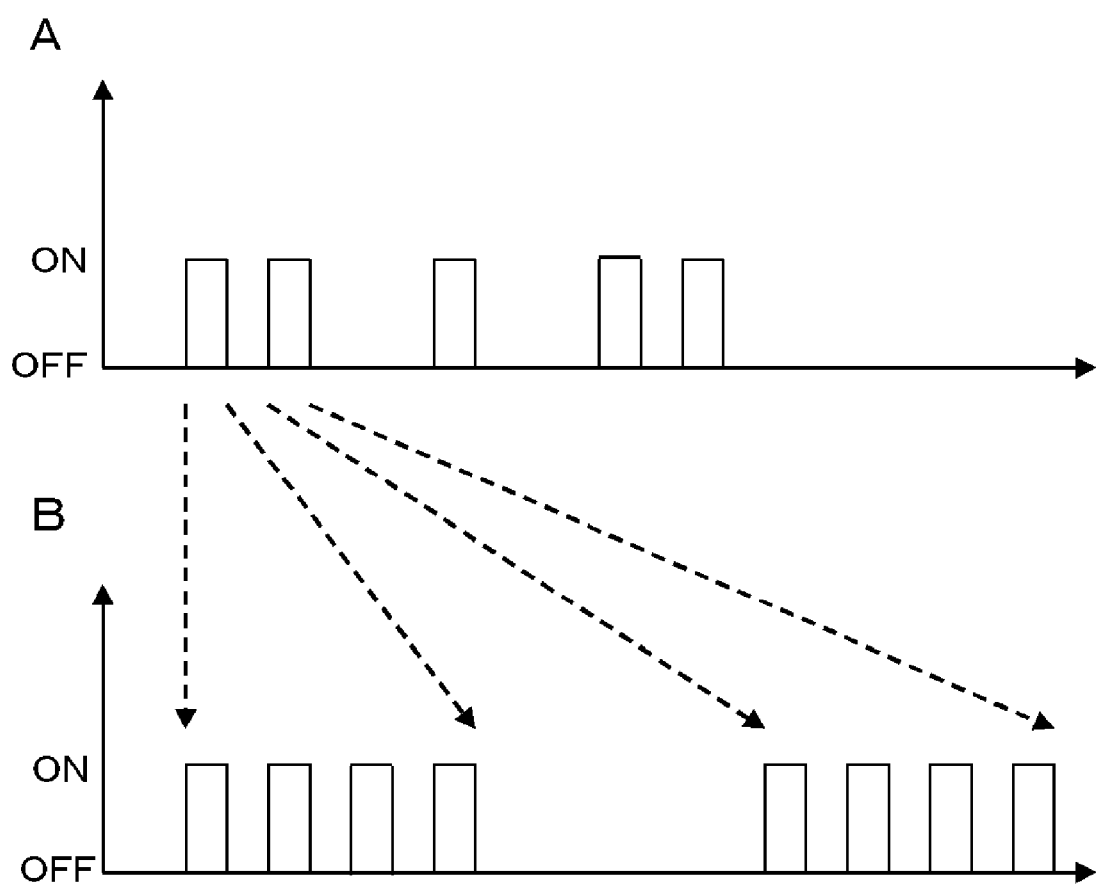
FIG. 2 is a view explaining an operation of the input/output signal controller according to the present invention.
Figure 3:
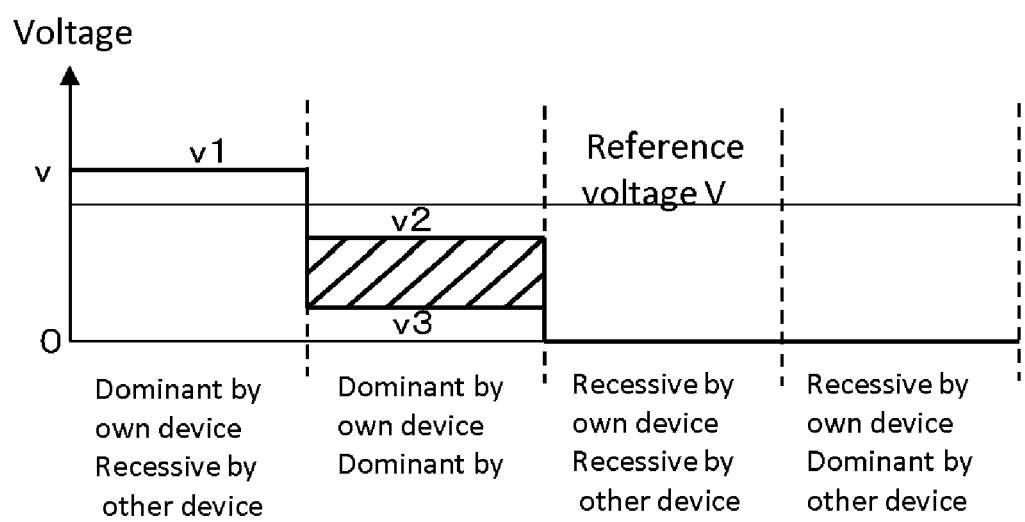
FIG. 3 is a view explaining the operation of the input/output signal controller according to the present invention.
Figure 4:
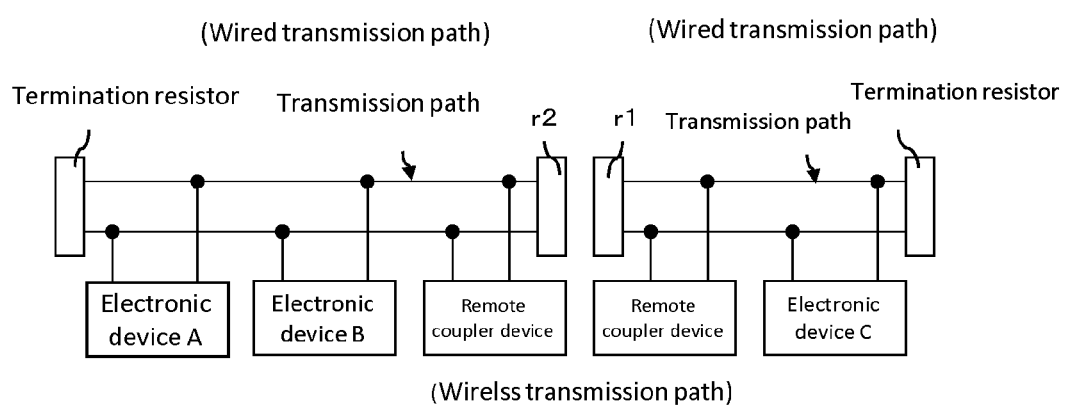
FIG. 4 is a block diagram showing an electronic control system for explaining other structure of the input/output signal controller according to the present invention.
Figure 5:
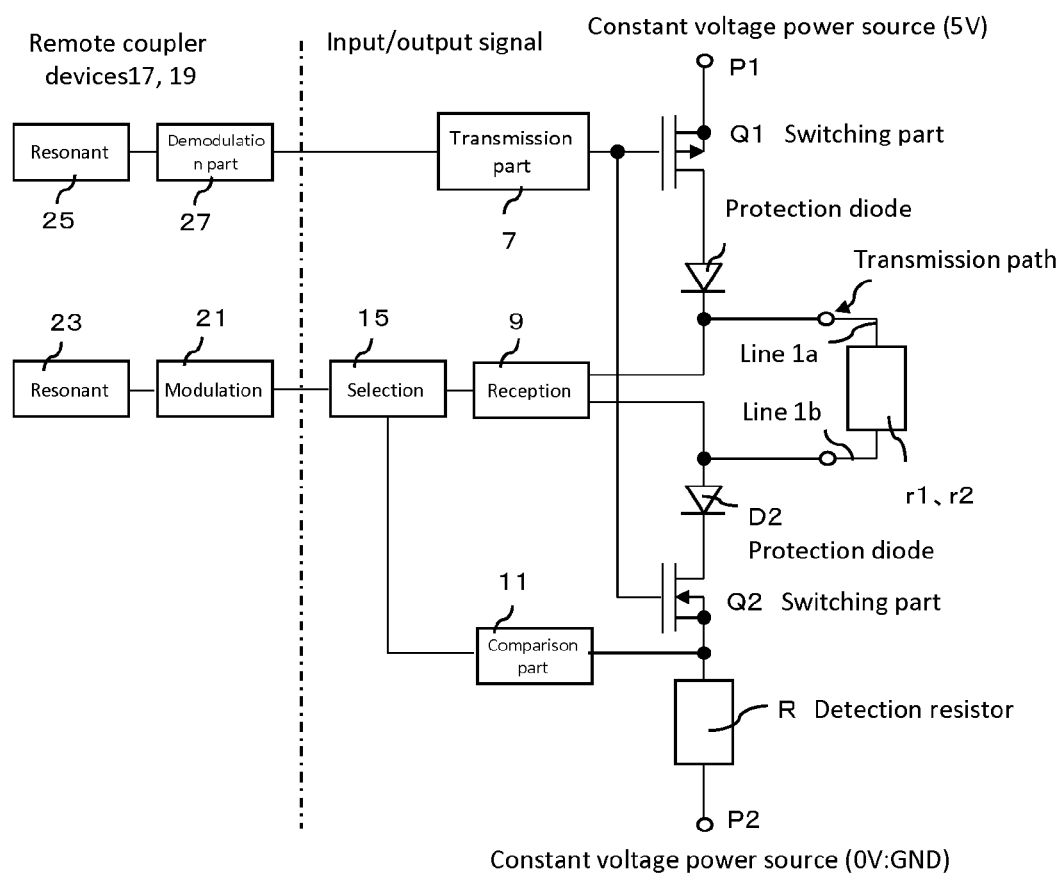
FIG. 5 is a block diagram explaining the input/output signal controller in FIG. 4.
Figure 6:
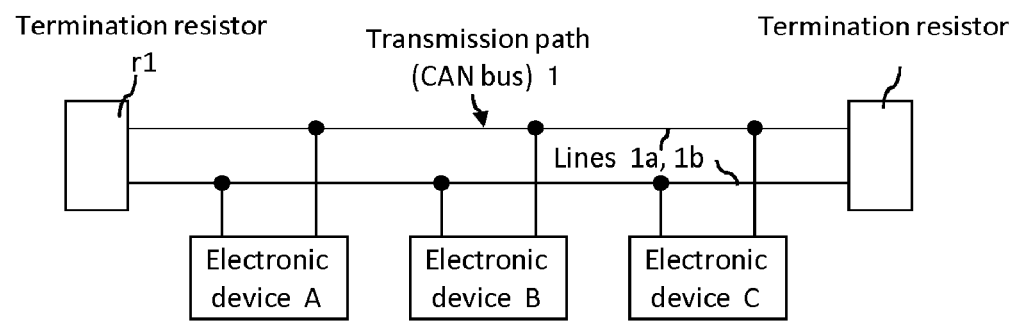
FIG. 6 is a block diagram showing an electronic control system and an electronic device, which are references of the present invention.
Figure 6:
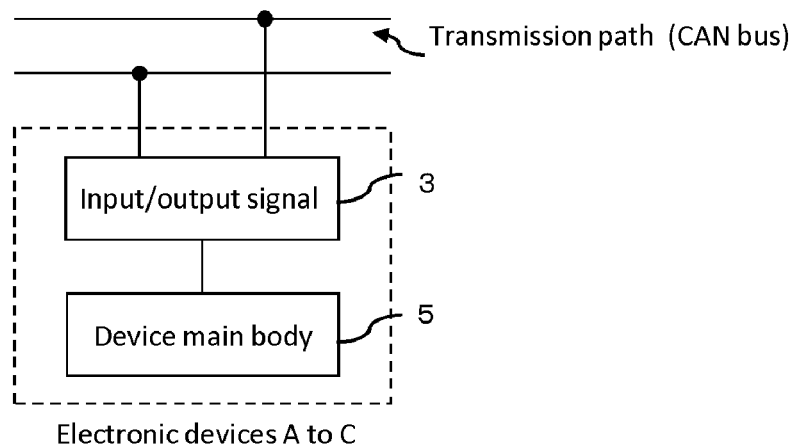
Figure 7:
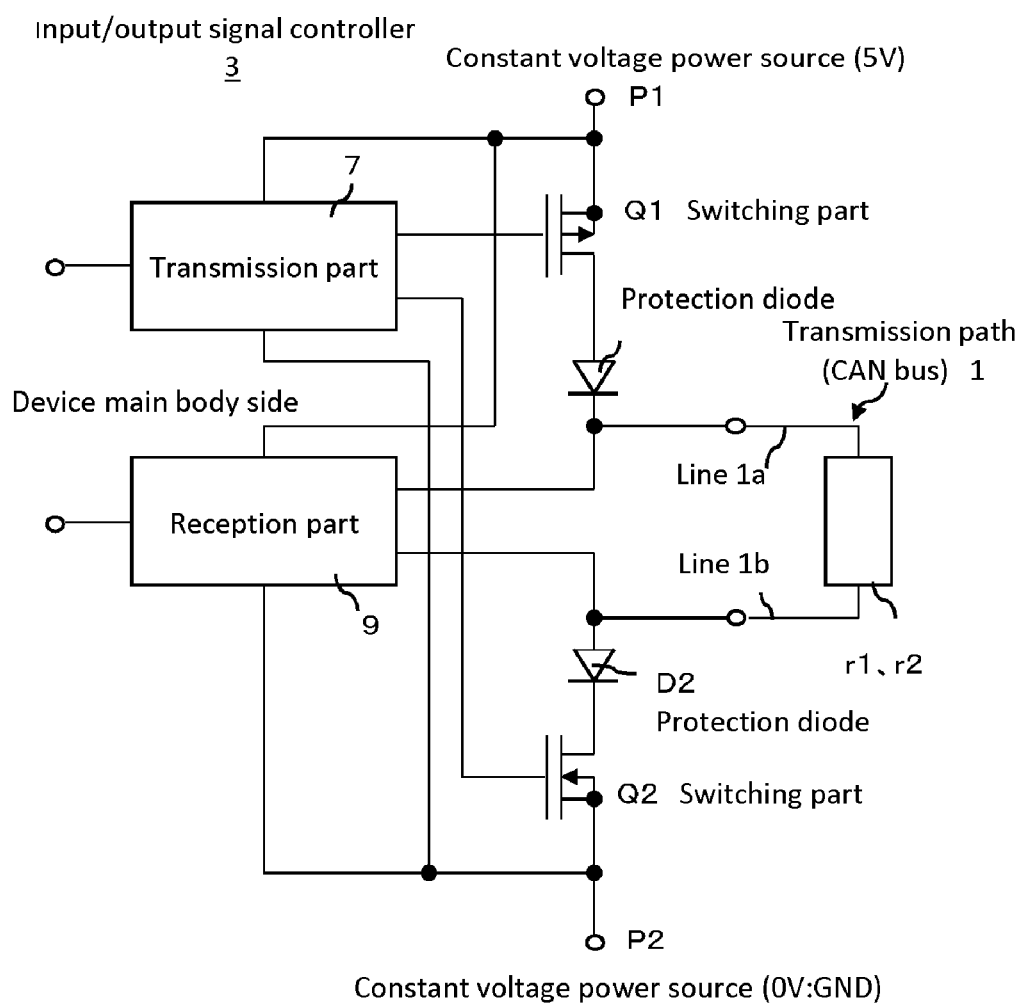
FIG. 7 is a block diagram showing a conventional input/output signal controller in FIG. 6.

DESCRIPTION OF SIGNS AND NUMERALS r1, r2: Termination resistors
1 Transmission path (CAN bus, wired transmission path)
1a, 1b Lines
3 Input/output signal controller
5 Device main body
7 Transmission part
9 Reception part
11 Comparison part (detection part)
13 Detection part
15 Selection part
17, 19 Remote coupler devices (wireless transmission paths)
21 Modulation part
23, 25 Resonant parts
27 Demodulation part
A, B, C Electronic devices
D1, D2 Diodes
P1, P2 Terminals
Q1, Q2 Switching parts
R Detection resistor (detection part)

The invention claimed is:

1. An input/output signal controller, comprising:
   a transmission part for outputting a transmission signal to a transmission path side, with termination resistors connected to both ends;
   switching parts connected to a constant voltage power source with the transmission path interposed, for switching on/off of power supply from the constant voltage power source and outputting the transmission signal to the transmission path, being the transmission signal from the transmission part;
   a reception part for receiving the transmission signal from the transmission path;
   a detection part connected between the constant voltage power source and the switching parts, for detecting output of the transmission signal flowing through the switching parts from the transmission part; and
   a selection part for selecting the reception part when the output of the transmission signal from the transmission part is not detected by the detection part.

2. The input/output signal controller according to claim 1, wherein the detection part has a resistor serially connected between the constant voltage power source and the switching parts.

3. The input/output signal controller according to claim 1 or 2, wherein when a both-end voltage is highest, being the both-end voltage of the detection part in a state that the transmission signal is outputted from the transmission part, the detection part controls the selection part so as not to select this reception part.

4. The input/output signal controller according to claim 1, wherein the transmission path is a wired transmission path connected to a wireless transmission path.

* * * * *